(12) United States Patent
Abel et al.

(10) Patent No.: US 11,293,098 B2
(45) Date of Patent: Apr. 5, 2022

(54) DIELECTRIC GAPFILL USING ATOMIC LAYER DEPOSITION (ALD), INHIBITOR PLASMA AND ETCHING

(71) Applicant: LAM RESEARCH CORPORATION, Fremont, CA (US)

(72) Inventors: Joseph Abel, West Linn, OR (US); Purushottam Kumar, Hillsboro, OR (US); Bart Van Schravendijk, Palo Alto, CA (US); Adrien Lavoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 26 days.

(21) Appl. No.: 16/032,176

(22) Filed: Jul. 11, 2018

(65) Prior Publication Data
US 2020/0017967 A1    Jan. 16, 2020

(51) Int. Cl.
| | | |
|---|---|---|
| *C23C 16/455* | (2006.01) | |
| *C23C 16/52* | (2006.01) | |
| *H01L 21/02* | (2006.01) | |
| *H01J 37/32* | (2006.01) | |

(Continued)

(52) U.S. Cl.
CPC ........ *C23C 16/45536* (2013.01); *C23C 16/52* (2013.01); *H01J 37/32449* (2013.01); *H01J 37/32458* (2013.01); *H01J 37/32724* (2013.01); *H01L 21/0228* (2013.01); *H01L 21/6833* (2013.01); *H01L 21/76224* (2013.01); *H01J 2237/327* (2013.01); *H01J 2237/3341* (2013.01)

(58) Field of Classification Search
CPC ... C23C 16/45536–45542; C23C 16/52; H01J 2237/3323; H01J 2237/3327; H01J 2237/3341; H01J 2237/3347; H01J 2237/3355; H01L 21/76224; H01L 21/76229; H01L 21/76237
USPC ............ 427/534, 535, 569, 579; 216/37, 39, 216/67–71; 438/694–703, 710–733, 438/785–794
See application file for complete search history.

(56) References Cited

U.S. PATENT DOCUMENTS

| | | | |
|---|---|---|---|
| 7,524,750 B2 * | 4/2009 | Nemani ............ | H01L 21/76224 257/E21.276 |
| 7,939,419 B2 * | 5/2011 | Lee ................... | H01L 21/76224 438/424 |
| 9,425,078 B2 | 8/2016 | Tang et al. | |

(Continued)

OTHER PUBLICATIONS

International Search Report and Written Opinion for PCT Application PCT/US2019/040904 dated Oct. 30, 2019.

*Primary Examiner* — Jose I Hernandez-Kenney (57) ABSTRACT

A method for performing gapfill of features of a substrate including a) arranging a substrate on a substrate support in a processing chamber; b) performing atomic layer deposition (ALD) to deposit film in a feature of the substrate; c) supplying an inhibitor plasma gas to the processing chamber and striking plasma in the processing chamber to inhibit deposition in upper portions of the feature as compared to lower portions of the feature; d) repeating b) N times, where N is an integer greater than one, and repeating c) M of the N times where M is an integer greater than zero and less than or equal to N; e) supplying an etch gas to the processing chamber to etch the film in the feature of the substrate; and f) repeating b) to e) one or more times to gapfill the feature of the substrate.

9 Claims, 7 Drawing Sheets

(51) Int. Cl.
    *H01L 21/683*     (2006.01)
    *H01L 21/762*     (2006.01)

(56) References Cited

U.S. PATENT DOCUMENTS

| | | | |
|---|---|---|---|
| 9,773,643 B1* | 9/2017 | Singhal | H01J 37/32577 |
| 9,978,610 B2* | 5/2018 | Fung | H01J 37/3244 |
| 10,037,884 B2* | 7/2018 | Ou | H01L 21/0228 |
| 10,096,514 B2* | 10/2018 | Anthis | H01L 21/31105 |
| 10,373,806 B2* | 8/2019 | Singhal | H01J 37/32174 |
| 10,395,944 B2* | 8/2019 | Fung | H01J 37/3244 |
| 10,643,846 B2* | 5/2020 | Smith | C23C 16/24 |
| 10,763,108 B2* | 9/2020 | Hausmann | H01L 21/02189 |
| 2007/0243693 A1* | 10/2007 | Nemani | H01L 21/76224 |
| | | | 438/424 |
| 2007/0287261 A1 | 12/2007 | Raaijmakers et al. | |
| 2008/0179715 A1 | 7/2008 | Coppa | |
| 2009/0137094 A1* | 5/2009 | Lee | H01L 21/76224 |
| | | | 438/424 |
| 2013/0175665 A1 | 7/2013 | Chudzik et al. | |
| 2015/0243545 A1* | 8/2015 | Tang | C23C 16/402 |
| | | | 438/430 |
| 2017/0053811 A1* | 2/2017 | Fung | H01L 21/67069 |
| 2017/0107621 A1* | 4/2017 | Suemori | C23C 16/52 |
| 2017/0250068 A1* | 8/2017 | Ishikawa | H01L 21/31111 |
| 2018/0005801 A1 | 1/2018 | Singhal et al. | |
| 2018/0033689 A1* | 2/2018 | Anthis | H01L 21/31105 |
| 2018/0061628 A1* | 3/2018 | Ou | H01L 21/0228 |
| 2018/0061663 A1* | 3/2018 | Chandrashekar | C23C 16/505 |
| 2019/0057858 A1* | 2/2019 | Hausmann | H01L 21/0228 |
| 2020/0090945 A1* | 3/2020 | Dole | H01L 21/31116 |

\* cited by examiner

DIELECTRIC GAPFILL USING ATOMIC LAYER DEPOSITION (ALD), INHIBITOR PLASMA AND ETCHING

FIELD

The present disclosure relates to substrate processing systems and methods, and more particularly to systems and methods for filling high aspect ratio features of substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition, etching, ashing, cleaning and other treatments of substrates such as semiconductor wafers. The substrate may be patterned to include features such as vias, holes and/or trenches. An aspect ratio of a feature refers to a ratio between the size of an opening of the feature in the substrate to a depth of the feature into the substrate. In some processes, the aspect ratio can be relatively high (e.g. greater than or equal to 5:1).

For example, shallow trench isolation (STI) features provide electrical isolation between transistors. STIs include trenches that are filled with silicon dioxide ($SiO_2$) film. Achieving void-free feature fill of high aspect ratio features is important because the film may be subjected to further processing. Subsequent integration steps can expose the void. The void may then be unintentionally filled with conductive material, which can lead to short circuits. For example, atomic layer deposition (ALD) may be used to gapfill high aspect ratio features with silicon dioxide ($SiO_2$) film. However, a seam or void usually remains at a center of the feature after the film that is deposited on the sidewalls merges or pinches off an upper portion of the feature.

SUMMARY

A method for performing gapfill of features of a substrate including a) arranging a substrate on a substrate support in a processing chamber; b) performing atomic layer deposition (ALD) to deposit film in a feature of the substrate; c) supplying an inhibitor plasma gas to the processing chamber and striking plasma in the processing chamber to inhibit deposition in upper portions of the feature as compared to lower portions of the feature; d) repeating b) N times, where N is an integer greater than one; e) supplying an etch gas to the processing chamber to etch the film in the feature of the substrate; and f) repeating b) to e) one or more times to gapfill the feature of the substrate.

In other features, d) further includes repeating c) during M of the N times, where M is an integer that is greater than zero and less than or equal to N.

In other features, b) includes supplying precursor gas to the processing chamber for a first predetermined period; evacuating the precursor gas from the processing chamber; supplying reactant gas to the processing chamber for a second predetermined period; and evacuating the reactant gas from the processing chamber.

In other features, the method includes striking plasma during b). The method includes striking plasma during e). The method includes not striking plasma during b). The method includes not striking plasma during e). The inhibitor plasma gas is selected from a group consisting of a nitrogen species, a fluorine species, nitrogen trifluoride ($NF_3$), molecular nitrogen ($N_2$), argon (Ar), helium (He), molecular hydrogen ($H_2$), ammonia ($NH_3$), amines, diols, diamines, aminoalcohols, thiols or combinations thereof. The feature comprises at least one of a via, hole and/or trench. The feature has an aspect ratio that is greater than or equal to 5:1.

A substrate processing system includes a processing chamber and a substrate support to support a substrate in the processing chamber. A gas delivery system supplies gas mixtures to the processing chamber. A plasma generating system generates plasma in the processing chamber. A controller is configured to control the gas delivery system and the plasma generating system to a) perform atomic layer deposition (ALD) to deposit film in a feature of the substrate; b) supply an inhibitor plasma gas to the processing chamber and strike plasma in the processing chamber to inhibit deposition in upper portions of the feature as compared to lower portions of the feature; c) repeating a) N times, where N is an integer greater than one; d) supply an etch gas to the processing chamber to etch the film in the feature of the substrate; and e) repeat a) to d) one or more times to gapfill the feature of the substrate.

In other features, c) further includes repeating b) during M of the N times, where M is an integer that is greater than zero and less than or equal to N.

In other features, during a), the controller is configured to supply precursor gas to the processing chamber for a first predetermined period; evacuate the precursor gas from the processing chamber; supply reactant gas to the processing chamber for a second predetermined period; and evacuate the reactant gas from the processing chamber.

In other features, the controller is configured to strike plasma during a). The controller does not strike plasma during a). The controller is configured to strike plasma during d). The controller does not strike plasma during d). The controller selects the inhibitor plasma gas from from is selected from a group consisting of a nitrogen species, a fluorine species, nitrogen trifluoride ($NF_3$), molecular nitrogen ($N_2$), argon (Ar), helium (He), molecular hydrogen ($H_2$), ammonia ($NH_3$), amines, diols, diamines, aminoalcohols, thiols or combinations thereof. The feature comprises at least one of a via, hole and/or trench. The feature has an aspect ratio that is greater than or equal to 5:1.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure allow void-free gapfill of high aspect ratio (HAR) features using dielectric film. In some examples, each atomic layer deposition (ALD) cycle deposits a monolayer of dielectric film and includes precursor, purge, reactant, and purge steps. Some or all of the ALD cycles can be followed by exposure to inhibitor plasma.

After multiple ALD and inhibitor plasma cycles are performed, an etch cycle is performed to etch back upper portions of the features. During processing, the number of ALD cycles can be varied relative to the number of inhibitor plasma cycles. The numbers of ALD and inhibitor plasma cycles can also be varied relative to the number of etching cycles. The ALD, inhibitor plasma and etch steps are repeated one or more times to allow void-free gapfill of the features with dielectric film.

Figure 1:
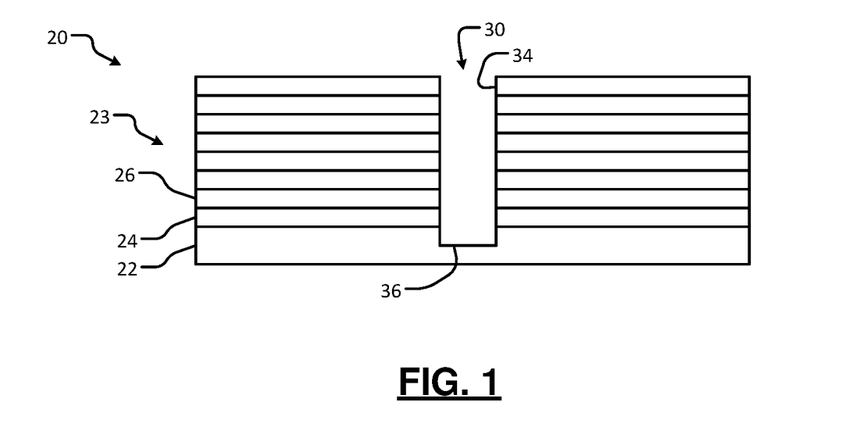
FIGS. 1 and 2 are side cross-sectional views illustrating ideal gapfill a feature of a substrate.
Figure 2:
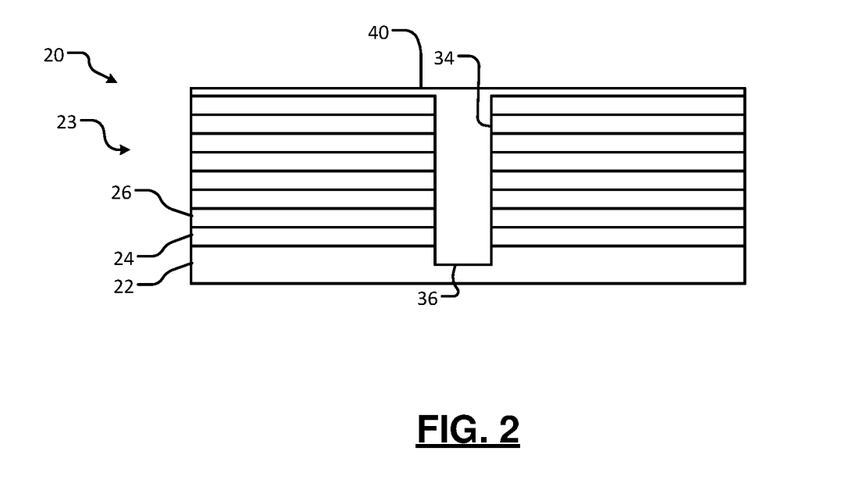

Referring now to FIGS. 1 and 2, an idealized example of a substrate 20 is shown. In FIG. 1, the substrate 20 includes one or more underlying layers 22 and a plurality of layers 23 deposited on the underlying layer 22. In some examples, the plurality of layers 23 may include alternating layers 24, 26 of different films. A feature 30 such as a trench, via or hole having a high aspect ratio (HAR) is formed in the layers 24, 26 and/or the underlying layers 22. In some examples, the HAR is greater than or equal to 5:1. The feature 30 includes sidewalls 34 and a bottom 36. In FIG. 2, the feature 30 is shown filled with a dielectric material 40 such as silicon oxide ($SiO_2$) or other dielectric material. As can be appreciated, the dielectric material 40 ideally completely fills the feature 30 without voids or gaps. In practice, however, voids or gaps are created during gap fill.

Figure 3A:
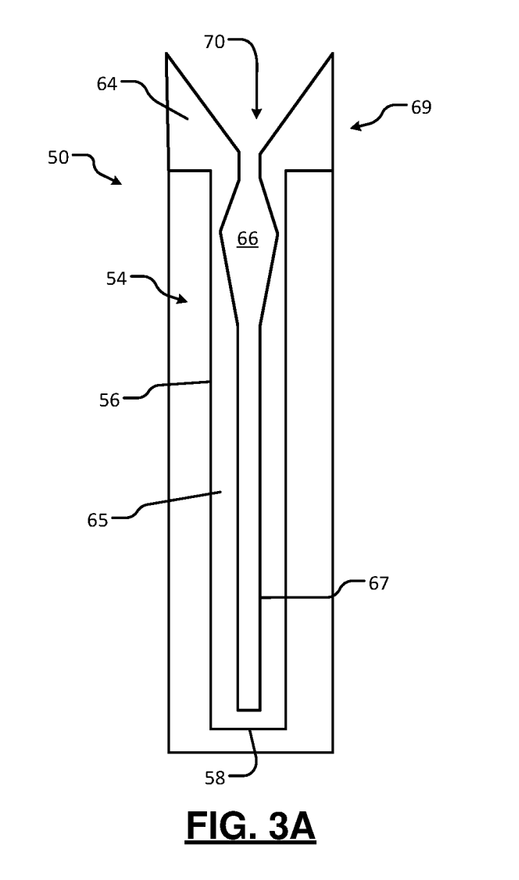
FIGS. 3A and 3B are side cross-sectional views illustrating gapfill a feature of a substrate using ALD.
Figure 3B:
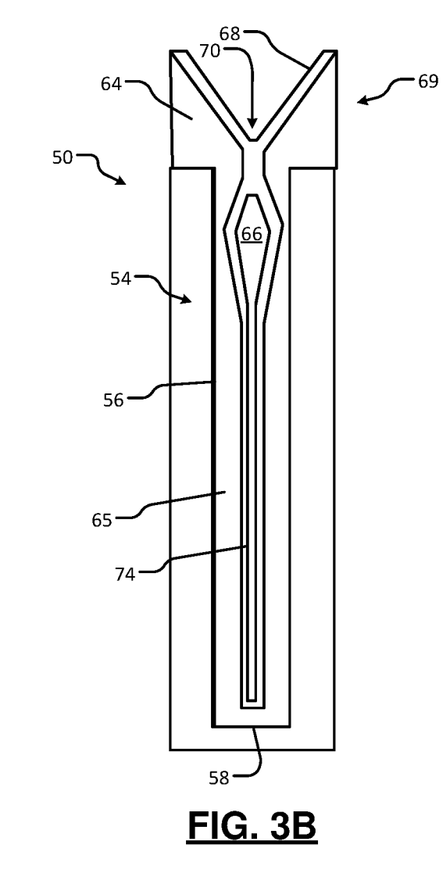

The features 30 in FIGS. 1 and 2 have uniform sidewalls and a uniform opening. In some processes, however, the sidewalls 34 and opening may have non-uniform profiles. In FIG. 3A, a substrate 50 defines a feature 54 including sidewalls 56 and a bottom 58. A dielectric material 64 is deposited in the feature 54 on the sidewalls 56 and bottom 58. The dielectric material 64 is deposited at 69 above an upper surface or field of the feature 54. The dielectric material 64 is pinched off at an opening 70, slightly expands into a void 66 and then extends downwardly (identified by lower feature region 67) towards the bottom 58 of the feature 54. In FIG. 3B, gapfill material 68 such as a dielectric film is deposited. For example, ALD cycles may be used to deposit one or more conformal monolayers of silicon dioxide ($SiO_2$). However, the gapfill material 68 pinches off the opening 70 before completely filling the void 66 and the lower feature region 67.

Figure 4A:
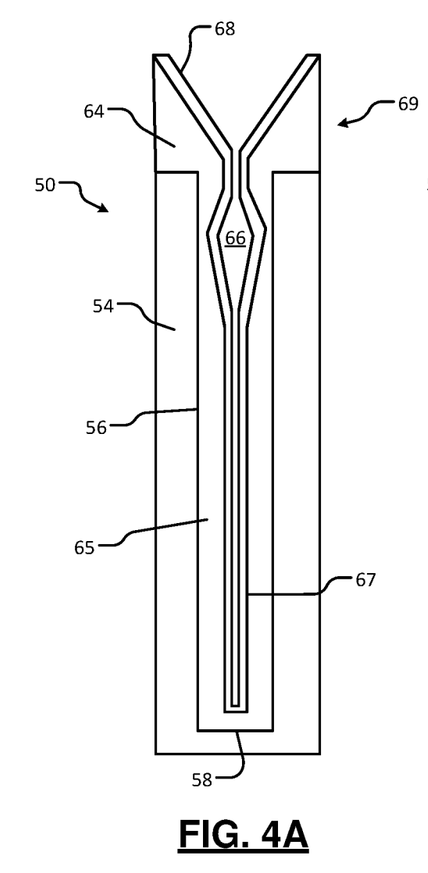
FIG. 4A to 4C are side cross-sectional sectional views illustrating gapfill a feature of substrate using deposition, etch and deposition (DED)
Figure 4B:
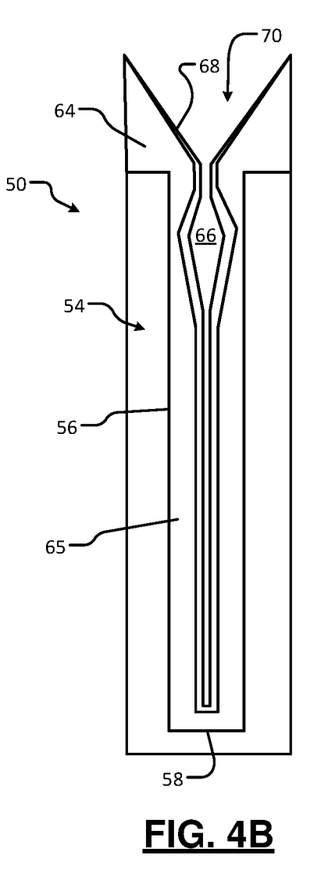
Figure 4C:
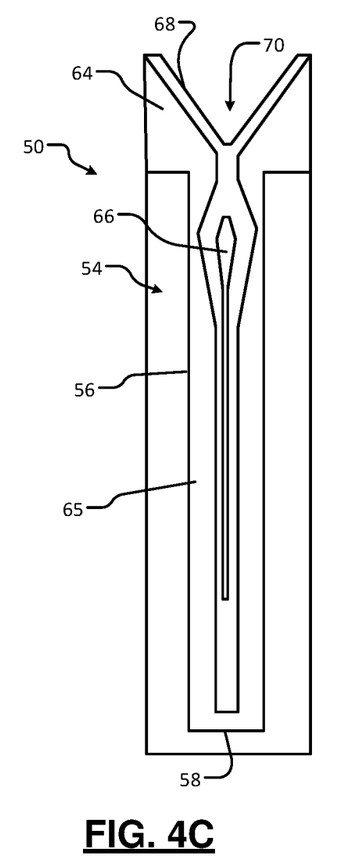

Referring now to FIGS. 4A to 4C, a process including ALD deposition, etch and deposition (DED) can be performed to increase the effectiveness of ALD gapfill in the feature. In other words, the feature 54 is partially filled by the gapfill material 68 and then etching is performed. In FIG. 4B, the etching removes some of the gapfill material 68 that is closer to the top of the feature 54 as compared to the bottom of the feature 54. As a result, the opening 70 remains open longer and more of the gapfill material 68 is deposited lower in the feature 54 as can be seen in FIG. 4C. As a result, the size of the void 66 is reduced.

Figure 5A:
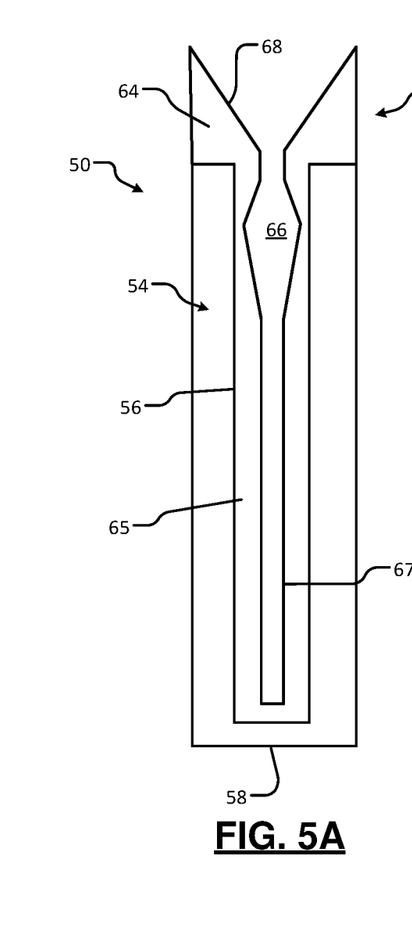
FIG. 5A to 5C are side cross-sectional sectional views illustrating gapfill of a feature of a substrate using ALD deposition and inhibitor plasma.
Figure 5B:
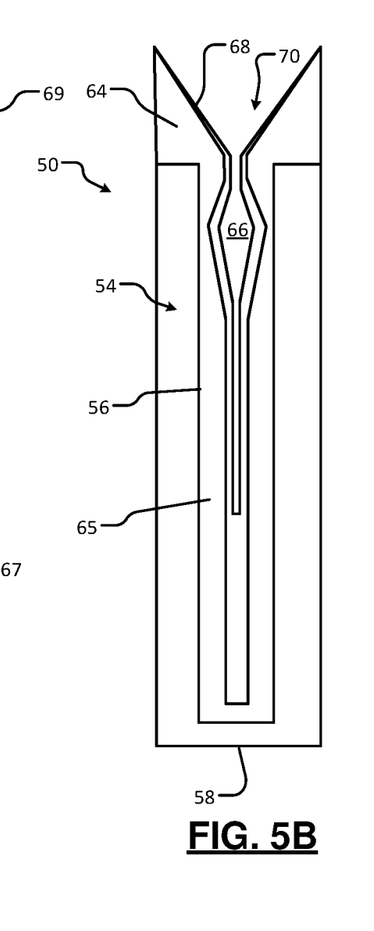
Figure 5C:
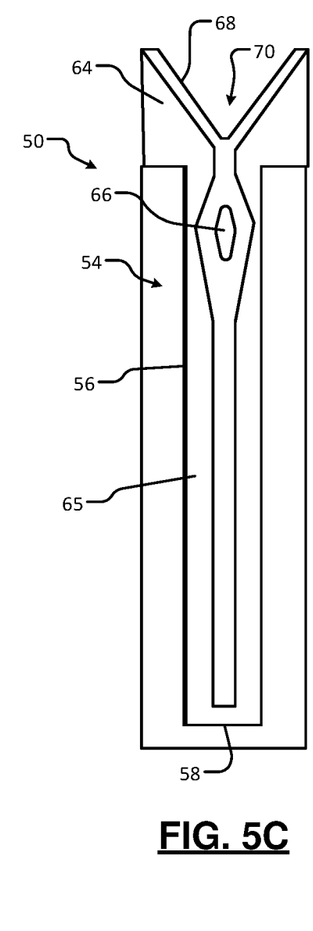

Referring now to FIGS. 5A to 5C, inhibitor plasma can be used prior to gapfill to slow deposition on the sidewalls 56 of the feature 54. The inhibitor plasma creates a passivated surface and increases a nucleation barrier of the deposited ALD film. When the inhibitor plasma interacts with material in the feature 54, the material at the bottom of the feature 54 receives much less plasma treatment than material located closer to a top portion of the feature 54 or the field because of the geometrical shadowing effect. As a result, deposition at the top of the feature 54 is selectively inhibited and deposition in lower portions of the feature 54 proceeds with less inhibition or without being inhibited. As a result, bottom-up fill is enhanced, which creates a more favorable sloped profile that mitigates the seam effect.

As can be seen in FIG. 5C, the size of the void 66 is substantially reduced and the void does not extend downwardly towards the bottom 58. However, it is still difficult to perform gapfill without creating the void 66.

Referring now to FIGS. 6A to 6D, systems and methods according to the present disclosure use a combination of ALD deposition, inhibitor plasma and etching to gapfill the feature without voids. In some examples, each atomic layer deposition (ALD) cycle deposits a monolayer of dielectric film and includes precursor, purge, reactant, and purge steps. Some or all of the ALD cycles are optionally followed by exposure to inhibitor plasma. For example, every $C^{th}$ ALD cycle can be followed by inhibitor plasma, where C is an integer greater than one.

After multiple ALD and inhibitor plasma cycles are performed, an etch cycle is performed to etch back upper portions of the features. In some examples, the inhibitor plasma can precede one or more of the ALD cycles. The ALD, inhibitor plasma and etch steps are repeated one or more times to allow void-free gapfill of the features with the dielectric film.

Figure 6A:
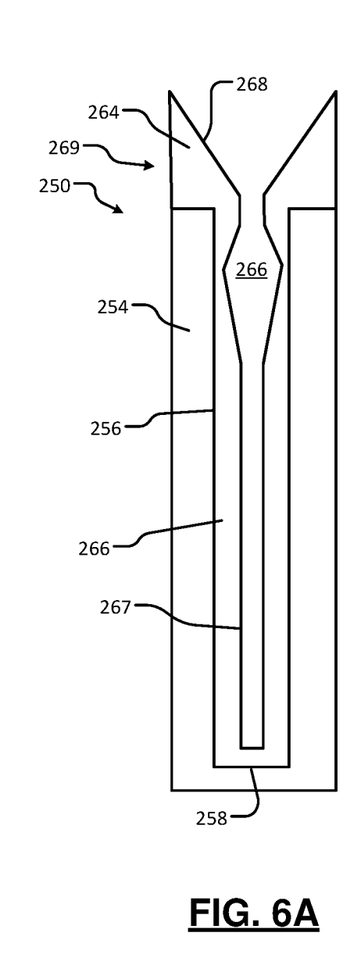
FIG. 6A to 6D are side cross-sectional sectional views illustrating gapfill a feature of substrate using a combination of deposition, inhibitor plasma and etching according to the present disclosure.

In FIG. 6A, a substrate 250 defines a feature 254 including sidewalls 256 and a bottom 258. A dielectric material 264 is deposited in the feature 254 on the sidewalls 256 and bottom 258. The dielectric material 264 is deposited at 269 above an upper surface of the feature 254. The dielectric material 264 is pinched off at an opening 270, slightly expands into a void 266 and then extends downwardly (identified by lower feature region 267) towards the bottom 258 of the feature 254.

Figure 6B:
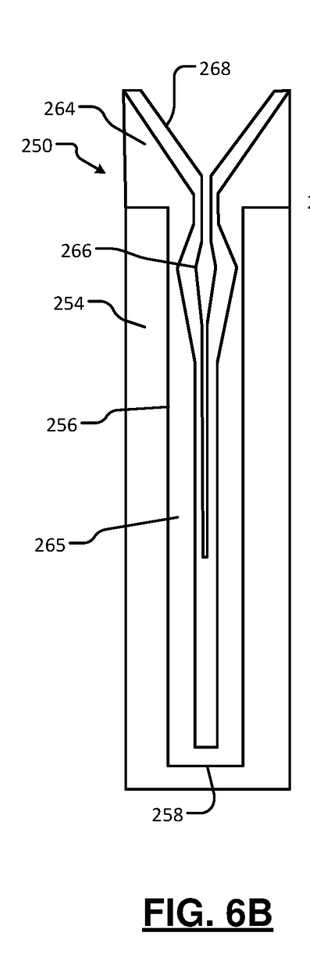

In FIG. 6B, when performing dielectric gapfill, R supercycles are performed where R is an integer greater than or equal to 1. The R supercycles includes T ALD deposition cycles to deposit dielectric material and S inhibitor plasma cycles to inhibit deposition in upper portions of the feature, where T and S are integers. In some examples, T is greater than or equal to S. For example, the inhibitor plasma cycle can be performed after every ALD cycle, every other ALD cycle and/or using other variations.

In some examples, the inhibitor plasma can include supplying RF plasma power in one frequency range, two or more frequency ranges, or alternating from one RF frequency range to another. For example, low frequency (LF) plasma power can be supplied in a frequency range from 400-430 kHz and/or high frequency (HF) plasma power can be supplied at a frequency of 13.56 MHz. In some examples, LF RF plasma power can be supplied at a power level in a range from 200 W to 5 kW and HF RF plasma power can be supplied at a power level in a range from 200 W to 6 kW.

In some examples, a gas mixture including nitrogen trifluoride ($NF_3$) and molecular nitrogen ($N_2$) may be used as the source gas for the inhibitor plasma, particularly when the deposited film is $SiO_2$, although other inhibitor plasma gases can be used. As can be appreciated, ALD $SiO_2$ nucleates at a slower rate after exposure to the inhibitor plasma and therefore more of the ALD $SiO_2$ is deposited in lower portions of the feature as compared to upper portions of the feature. While not being bound to any specific theory, it is believed that the inhibitor plasma interferes with the OH surface bonds that ordinarily allow absorption of precursor on the surface.

In other examples, the inhibitor plasma source gas is selected from a group consisting of a nitrogen species, a fluorine species, nitrogen trifluoride ($NF_3$), molecular nitrogen ($N_2$), argon (Ar), helium (He), molecular hydrogen ($H_2$), ammonia ($NH_3$), amines (such as methylamine, dimethylamine, trimethylamine, and triethylamine), diols (such as ethyleneglycol), diamines (such as ethylenediamine), aminoalcohols (such as 1-amino-2-ethanol), thiols (such as monothiols and dithiols (e.g. ethanedithiol)) or combinations thereof. Each of the R supercycles also includes an etching step after the T deposition cycles and S inhibitor plasma cycles. Etching of the gapfill material is performed to etch back material located in the upper regions of the feature more than gapfill material located in lower regions of the feature 254.

Figure 6C:
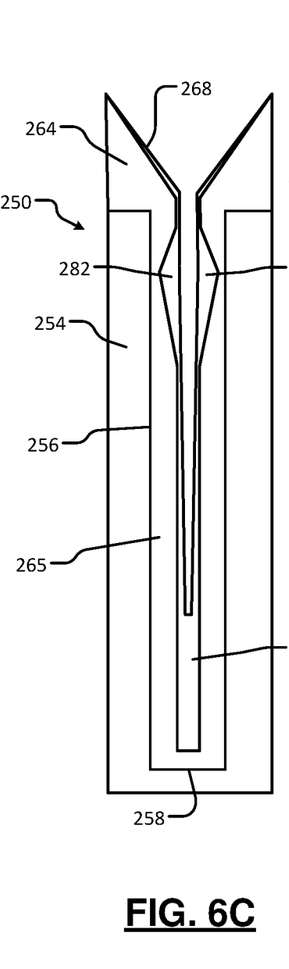
Figure 6D:
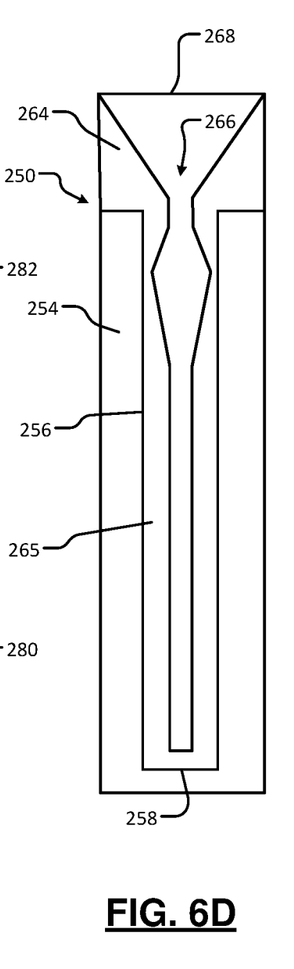

As can be seen in FIG. 6C, the feature 254 of the substrate 250 is shown partially filled after M of the R supercycles where M is an integer less than R. Lower portions of the feature 254 are filled as shown at 280. Portions 282 of the void immediately adjacent to the sidewalls are filled. Little or no film is located in upper regions of the feature 254 due to the etching. As can be seen in FIG. 6D, the feature 254 of the substrate 250 is shown completely filled after the R supercycles.

Figure 7:
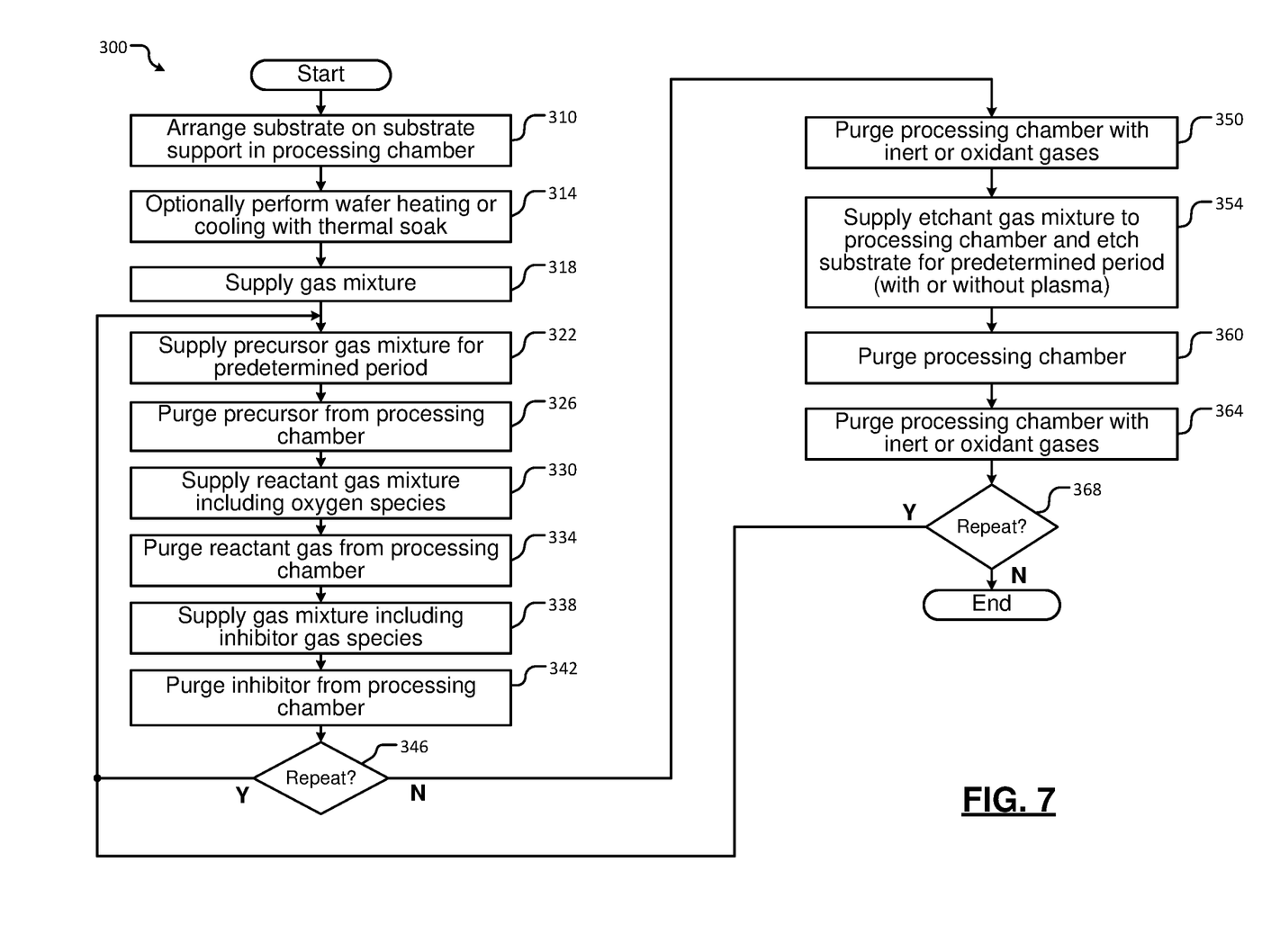
FIG. 7 is a flowchart illustrating a method for gapfilling a feature of a substrate using a combination of ALD deposition, inhibitor plasma and etching according to the present disclosure.

Referring now to FIG. 7, a method 300 for performing gapfill according to the present disclosure is shown. At 310, a substrate is arranged on a substrate support in a processing chamber. Chamber parameters are set to predetermined values. For example at 314, wafer heating or cooling may be performed with a thermal soak. At 318, a gas mixture including inert or carrier gas may be supplied to the processing chamber. At 322, one or more precursor gases are supplied to the processing chamber for a predetermined period. In some examples, plasma is struck in the processing chamber during the supply of the precursor gas mixture and then extinguished after the predetermined period. In other examples, thermal ALD is performed and plasma is not used. The precursor gas mixture is evacuated from the processing chamber at 326. In some examples, the purging includes supplying an inert gas to the processing chamber and pumping the inert gas out of the processing chamber for a predetermined purge period.

At 330, a reactant gas mixture is supplied to the processing chamber for a predetermined period. In some examples, the reactant gas mixture includes an oxygen species. In some examples, plasma is struck in the processing chamber during the supply of the precursor gas mixture and then extinguished after the predetermined period. In other examples, thermal ALD is performed and plasma is not used. At 334, the reactant gas mixture is evacuated from the processing chamber.

At 338, a gas mixture including inhibitor plasma gas species is supplied to the processing chamber. Plasma is struck in the processing chamber for a predetermined period and then extinguished. At 342, the inhibitor plasma gas mixture is purged from the processing chamber. At 346, the method returns to step 322 and repeats one or more times. As can be appreciated, the steps 338 and 342 do not need to be repeated during each cycle.

When the ALD deposition and inhibitor plasma cycles are complete, the method continues at 350 and an optional purging step may be performed using inert or oxidant gases. At 354, an etch gas mixture is supplied to the processing chamber for a predetermined period (with or without striking and extinguishing plasma). At 360, the etch gas mixture is evacuated from the processing chamber. At 364, the processing chamber is purged with inert or oxidant gases. At 368, the method returns for additional supercycles if needed or the method ends.

As can be appreciated, the number of cycles of ALD deposition and inhibitor plasma can be varied between etching steps. Furthermore, a last one of the cycles of ALD deposition and inhibitor plasma may omit the inhibitor plasma step prior to the etching step if desired. Furthermore, multiple ALD cycles can be performed prior to each inhibitor plasma step.

Figure 8:
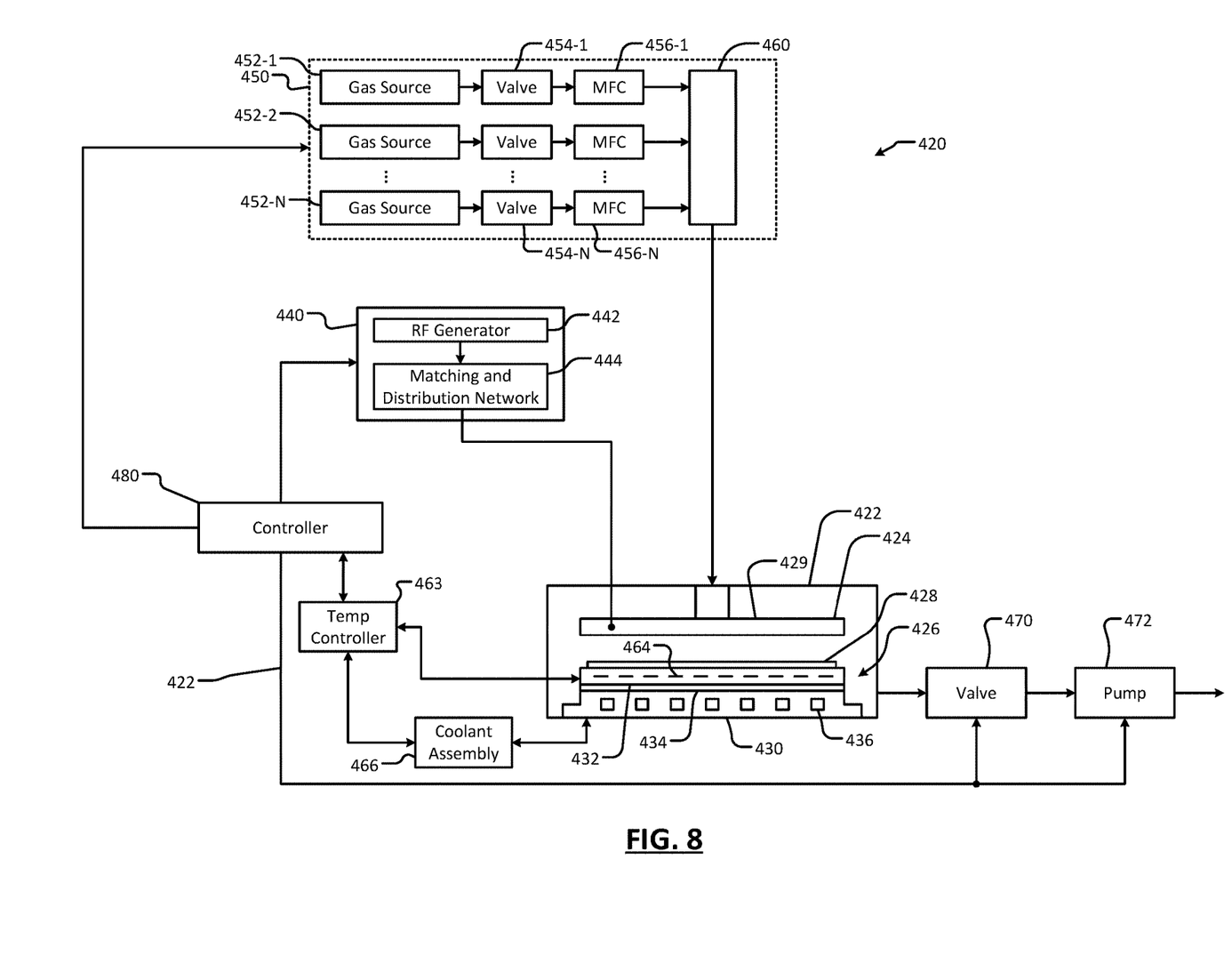
FIG. 8 is a functional block diagram of a substrate processing chamber for performing gapfill according to the present disclosure.

Referring now to FIG. 8, an example substrate processing system 420 is shown. The substrate processing system 420 includes a processing chamber 422 that encloses other components of the substrate processing system 420 and contains the RF plasma (if used). The substrate processing system 420 includes an upper electrode 424 and an electrostatic chuck (ESC) 426 or other substrate support. During operation, a substrate 428 is arranged on the ESC 426.

For example only, the upper electrode 424 may include a gas distribution device 429 such as a showerhead that introduces and distributes process gases. The gas distribution device 429 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, other process gases or purge gas flows. Alternately, the upper electrode 424 may include a conducting plate and the process gases may be introduced in another manner.

The ESC 426 includes a baseplate 430 that acts as a lower electrode. The baseplate 430 supports a heating plate 432, which may correspond to a ceramic multi-zone heating plate. A thermal resistance layer 434 may be arranged between the heating plate 432 and the baseplate 430. The baseplate 430 may include one or more channels 436 for flowing coolant through the baseplate 430.

If plasma is used, an RF generating system 440 generates and outputs an RF voltage to one of the upper electrode 424 and the lower electrode (e.g., the baseplate 430 of the ESC 426). The other one of the upper electrode 424 and the baseplate 430 may be DC grounded, AC grounded or floating. For example only, the RF generating system 440 may include an RF generator 442 that generates RF power that is fed by a matching and distribution network 444 to the upper electrode 424 or the baseplate 430. In other examples, the plasma may be generated inductively or remotely.

A gas delivery system 450 includes one or more gas sources 452-1, 452-2, . . . , and 452-N (collectively gas sources 452), where N is an integer greater than zero. The gas sources 452 are connected by valves 454-1, 454-2, ..., and 454-N (collectively valves 454) and mass flow controllers 456-1, 456-2, ..., and 456-N (collectively mass flow controllers 456) to a manifold 460. While a single gas delivery system 450 is shown, two or more gas delivery systems can be used. An output of the manifold 460 is fed to the processing chamber 422.

A temperature controller 463 may be connected to a plurality of thermal control elements (TCEs) 464 arranged in the heating plate 432. The temperature controller 463 may be used to control the plurality of TCEs 464 to control a temperature of the ESC 426 and the substrate 428. The temperature controller 463 may communicate with a coolant assembly 466 to control coolant flow through the channels 436. For example, the coolant assembly 466 may include a coolant pump, a reservoir and/or one or more temperature sensors. The temperature controller 463 operates the coolant assembly 466 to selectively flow the coolant through the channels 436 to cool the ESC 426.

A valve 470 and pump 472 may be used to evacuate reactants from the processing chamber 422. A system controller 480 may be used to control components of the substrate processing system 420.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
   a) arranging a substrate including a feature on a substrate support in a processing chamber;
   b) performing atomic layer deposition (ALD) N times to deposit film in the feature of the substrate in the processing chamber, where N is an integer greater than one;
   c) after performing b) M of the N times, where M is an integer that is greater than zero and less than or equal to N, supplying an inhibitor plasma gas to the processing chamber and striking plasma in the processing chamber to create a passivated surface more on upper portions of the feature as compared to lower portions of the feature to inhibit the atomic layer deposition in the upper portions of the feature as compared to the lower portions of the feature;
   d) supplying an etch gas to the processing chamber to etch the film more in the upper portions of the feature than in the lower portions in the feature of the substrate following c); and
   e) repeating b) to d) one or more times to gapfill the feature without voids.

2. The method of claim 1, wherein b) includes:
   supplying precursor gas to the processing chamber for a first predetermined period;
   evacuating the precursor gas from the processing chamber;
   supplying reactant gas to the processing chamber for a second predetermined period; and
   evacuating the reactant gas from the processing chamber.

3. The method of claim 1, further comprising striking plasma during b).

4. The method of claim 1, further comprising striking plasma during d).

5. The method of claim 1, further comprising not striking plasma during b).

6. The method of claim 1, further comprising not striking plasma during d).

7. The method of claim 1, wherein the inhibitor plasma gas is selected from a group consisting of a nitrogen species, a fluorine species, nitrogen trifluoride ($NF_3$), molecular nitrogen ($N_2$), argon (Ar), helium (He), molecular hydrogen ($H_2$), ammonia ($NH_3$), amines, diols, diamines, aminoalcohols, thiols or combinations thereof.

8. The method of claim 1, wherein the feature comprises at least one of a via, hole and/or trench.

9. The method of claim 1, wherein the feature has an aspect ratio that is greater than or equal to 5:1.

* * * * *